United States Patent
Edfors

(10) Patent No.: US 9,836,221 B1
(45) Date of Patent: Dec. 5, 2017

(54) CONFIGURABLE HIGH SPEED FPGA SCAN MECHANISM CONTROLLER

(71) Applicant: Ball Aerospace & Technologies Corp., Boulder, CO (US)

(72) Inventor: Scott E. Edfors, Boulder, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 7 days.

(21) Appl. No.: 14/937,715

(22) Filed: Nov. 10, 2015

Related U.S. Application Data

(60) Provisional application No. 62/077,791, filed on Nov. 10, 2014.

(51) Int. Cl.
*G06F 12/00* (2006.01)
*G06F 13/00* (2006.01)
*G06F 13/28* (2006.01)
*G06F 3/06* (2006.01)

(52) U.S. Cl.
CPC .............. *G06F 3/061* (2013.01); *G06F 3/064* (2013.01); *G06F 3/0673* (2013.01)

(58) Field of Classification Search
CPC ......... G06F 3/061; G06F 3/064; G06F 3/0673
USPC ....................................................... 711/156
See application file for complete search history.

(56) References Cited

U.S. PATENT DOCUMENTS

| | | | | |
|---|---|---|---|---|
| 5,999,168 | A * | 12/1999 | Rosenberg | A63F 13/06 345/156 |
| 6,362,650 | B1 * | 3/2002 | New | G06F 15/7867 326/41 |
| 7,185,309 | B1 * | 2/2007 | Kulkarni | G06F 17/5027 716/104 |
| 7,228,520 | B1 * | 6/2007 | Keller | G06F 17/5054 716/116 |
| 7,330,924 | B1 * | 2/2008 | Kao | H04L 12/56 370/248 |
| 7,552,042 | B1 * | 6/2009 | Brebner | G06F 17/5054 703/14 |
| 7,770,179 | B1 * | 8/2010 | James-Roxby | G06F 17/5054 719/312 |
| 8,006,021 | B1 * | 8/2011 | Li | G06F 13/4059 710/110 |
| 8,799,750 | B1 * | 8/2014 | Parekh | H03M 13/235 711/217 |
| 9,331,608 | B2 * | 5/2016 | Mast, Jr. | H02P 3/04 |
| 9,600,018 | B1 * | 3/2017 | Majumdar | G06F 1/00 |
| 2005/0242836 | A1 * | 11/2005 | Goetting | G01R 31/3167 326/39 |

(Continued)

*Primary Examiner* — Sheng-Jen Tsai
(74) *Attorney, Agent, or Firm* — Sheridan Ross P.C.

(57) ABSTRACT

Control systems and methods are provided. The systems and methods include a field programmable gate array (FPGA) in which a plurality of functional processing units (FPUs) are formed, and one or memories having a plurality of memory locations. An input signal is received from a sensor and is processed in at least some of the FPUs. The FPUs can be reused one or more times during the processing of a single input signal. The system can also receive a control signal as an additional input. In response to the inputs, an output signal is generated. The output signal can be used to control an actuator. In accordance with further embodiments, the operation of the FPUs can be reconfigured by storing different operating parameter values in memory.

17 Claims, 6 Drawing Sheets

(56) References Cited

U.S. PATENT DOCUMENTS

| | | | | |
|---|---|---|---|---|
| 2005/0242980 A1* | 11/2005 | Collins | .......... | G01R 31/318555 341/155 |
| 2005/0262492 A1* | 11/2005 | Goetting | ........ | G01R 31/318536 717/151 |
| 2012/0326748 A1* | 12/2012 | Kim | ................ | H03K 19/17704 326/38 |
| 2014/0285132 A1* | 9/2014 | Mast, Jr. | ................ | H02P 3/025 318/626 |
| 2014/0355359 A1* | 12/2014 | Linam | .................... | G11C 7/222 365/189.02 |

* cited by examiner

CONFIGURABLE HIGH SPEED FPGA SCAN MECHANISM CONTROLLER

CROSS-REFERENCE TO RELATED APPLICATIONS

The present application claims the benefit of U.S. Provisional Patent Application Ser. No. 62/077,791, filed Nov. 10, 2014, the entire disclosure of which is hereby incorporated herein by reference.

FIELD

A scan mechanism controller with configurable processors having math function blocks is provided.

BACKGROUND OF THE INVENTION

Control systems are used in a variety of applications. In simple configurations, these systems can include proportional-integral (PI), and proportional-integral-derivative (PID) controllers. These controllers can be implemented in mechanical, analog electronic, or digital electronic forms. Mechanical control systems are usually limited to relatively simple mechanical systems. Therefore, for controlling systems involving electrical sensors or actuators, particularly in aerospace applications, electronic controllers are typically employed.

Analog electronic systems can be designed that feature relatively fast response times. However, analog systems are typically inflexible, and can suffer from performance variations due to changes in ambient conditions, age, or other variables. For complex control systems, digital controllers are increasingly popular. Digital implementations can include the use of general purpose processors executing software instructions, application specific digital signal processors (DSPs) or integrated circuits, or field programmable gate arrays.

General purpose space flight qualified microprocessors with floating point co-processors provide floating point processing capability, but at a much slower processing speed and generally do not provide additional interfaces to A/D and D/A devices. These devices also require project specific software in order to implement the Controls System algorithm. Commercial microcontroller digital signal processor application-specific chipsets have been used for non-space flight applications. General purpose space flight qualified microprocessors with floating point co-processors combined with application specific field programmable gate arrays (FPGAs) have been used for space flight applications. However, the flexibility and scalability of such systems has been limited. Commercial Microcontroller DSP application-specific chipsets provide the technical features (floating point processing capability with standard serial peripheral interface bus (SPI) interfaces to analog to digital (A/D), (D/A) devices), but cannot survive the space environment.

SUMMARY

In accordance with embodiments of the present disclosure, a configurable, highly adaptable control system is provided. The control system can utilize a field programmable gate array (FPGA). The FPGA can include one or more memories. Input values corresponding to control signals can be stored in the memory. The input values can be selectively read from memory to logic blocks or floating-point units (FPUs) defined within the FPGA. Intermediate output values calculated by an FPU can be delivered to another FPU, according to the interconnections defined within the FPGA, or can be written to a location in memory. An intermediate output value written to memory can be read from the memory and can be provided to another FPU as an operand for an operation performed by the other FPU. This unique architecture allows one or more FPUs within the FPGA to be reused. After a final operation by an FPU, the resulting final output value can be provided to a controlled device, for example via a control output interface.

In accordance with further embodiments of the present disclosure, parameters associated with operations performed by FPUs on operands, whether those operands are initial inputs or are intermediate output values, can be reconfigured. Moreover, such reconfiguration can be performed prior to or during execution of a control operation. For example, parameter values stored in memory can be changed as required to adapt the system to different controlled devices prior to run time. As another example, a first parameter value can be read from a location in memory and used by an FPU in connection with a first operation during a control sequence in connection with a first operand, and a second parameter value can be read from another location in memory and used by that FPU in connection with a second operation during the control sequence in connection with a second operand.

Additional features and advantages of embodiments of the present disclosure will become more readily apparent from the following description, particularly when taken together with the accompanying drawings.

DETAILED DESCRIPTION

Figure 1:
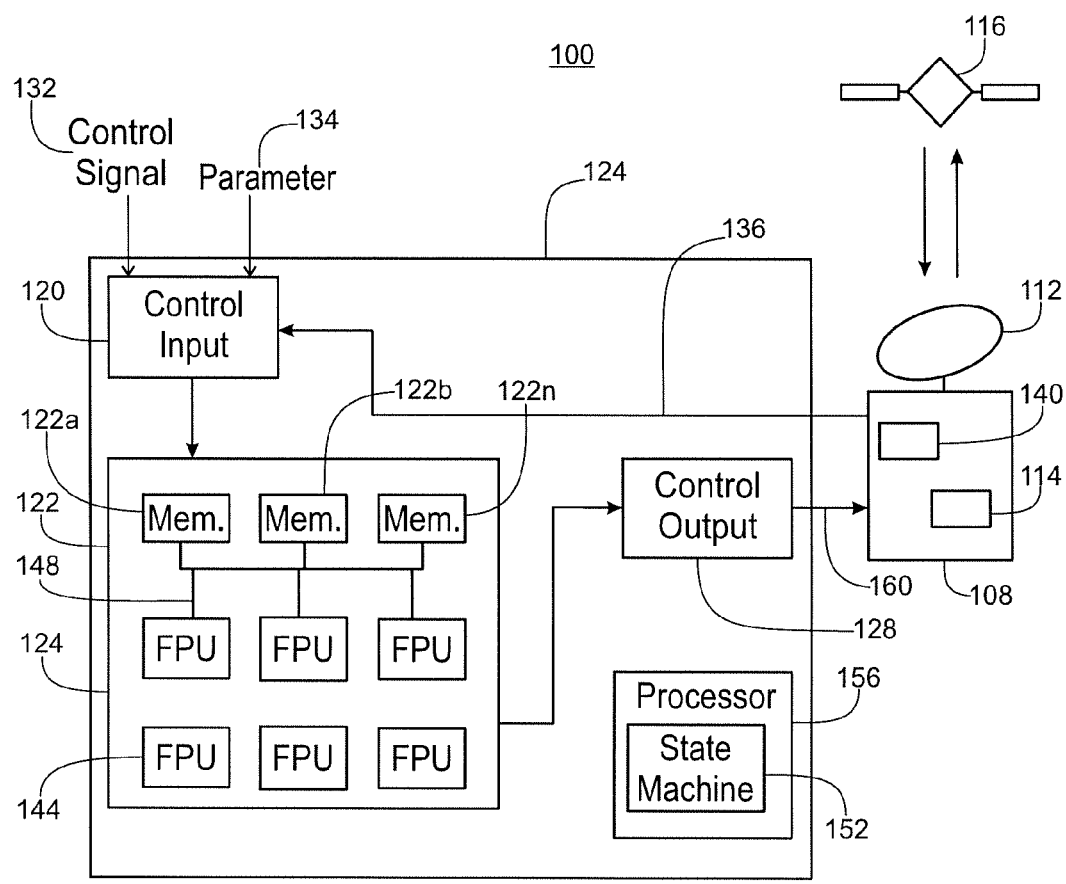
FIG. 1 depicts an example system incorporating a controller in accordance with embodiments of the present disclosure.

An example system 100 incorporating a controller or control system 104 in accordance with embodiments of the present disclosure is depicted in FIG. 1. The system 100 generally includes the controller 104, and a controlled device 108. As an example, but without limitation, the controlled device 108 can include a scanner tracker or fast steering mirror 112 and an associated actuator 114. Moreover, in this example, the fast steering mirror 112 can be used in various applications, for example, but without limitation, for implementing one end of a laser communication link with a remote platform or satellite 116.

The controller 104 can include a control input interface 120, memory 122, a field programmable gate array (FPGA) 124 having a plurality of programmable logic blocks or floating point units 144, and a control output interface 128.

In a typical implementation, the memory 122 is provided as part of the FPGA 124 itself. Alternatively or in addition, the memory 122 can be provided separately from the FPGA 124. The control input interface 120 can receive signals from various sources. For instance, a control signal 132, a parameter signal 134, and a position signal 136 can be provided to the control input interface 120. An example of a control signal 132 is a pointing or steering signal provided from a control authority, either local to or remote from the controller 104, that directs the steering mirror 112 to point a laser beam toward a particular target, such as a selected satellite 116. As another example, a control signal 134 can comprise a math processing parameter for configuring a mathematical operation, and can be stored in memory 122 when the control system 104 is initially configured, or at any time prior to execution of the mathematical operation that applies the parameter 134. As yet another example, a control signal 136 can include a signal from a position sensor 140 included as part of the controlled device 108 indicating the actual position of a steering mirror 112 or other components.

Figure 2:
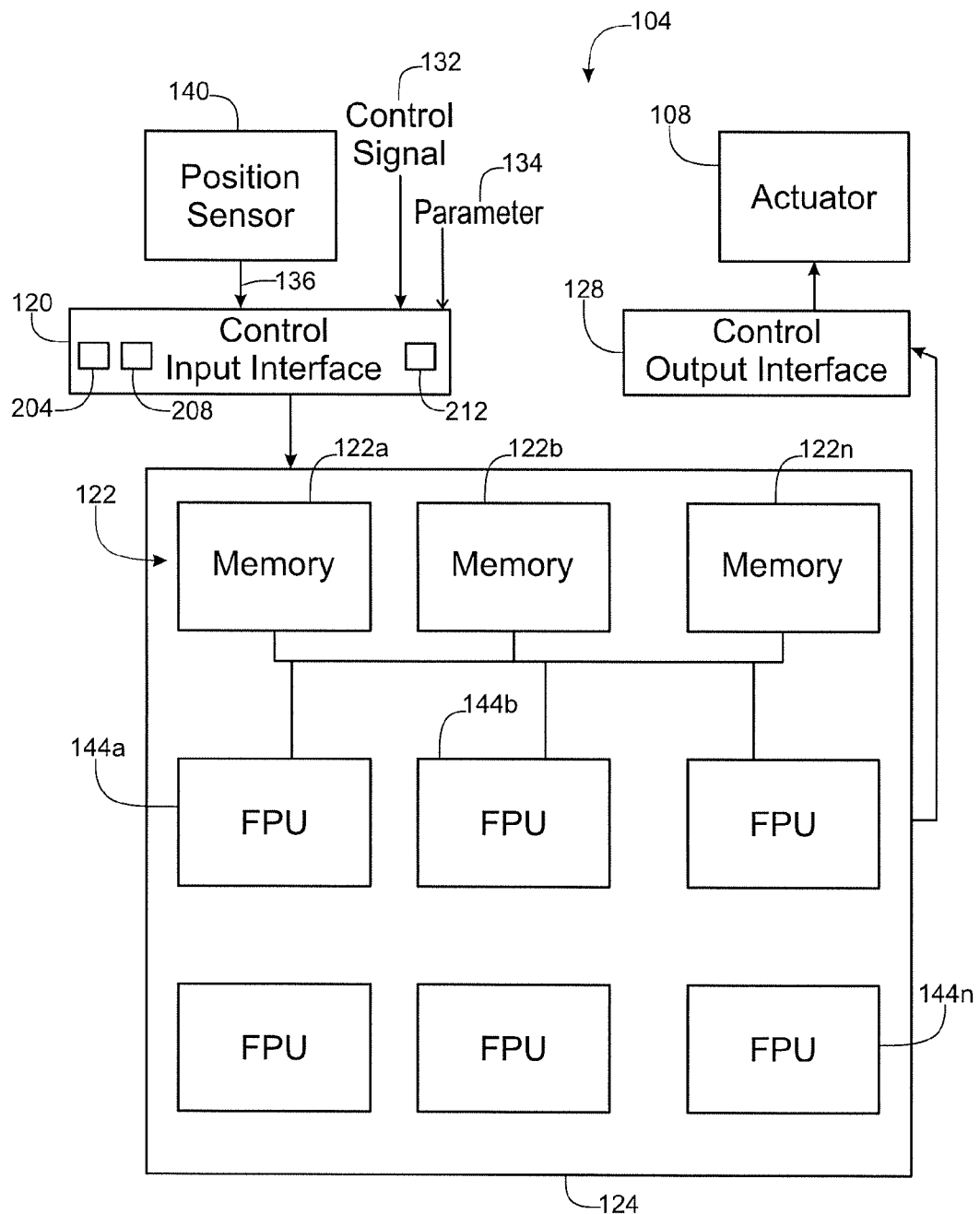
FIG. 2 depicts components of a controller in accordance with embodiment of the present disclosure.

The control input interface 120 can therefore provide one or more inputs that receive control signals 132, parameters 134, position signals 136, or other signals. The control input interface 120 can perform various signal conditioning functions. For instance, an input signal 132, 134 or 136 can be filtered, amplified, or otherwise modified. Accordingly, the control input interface 120 can include a filter block 204 and an amplifier 208 (see FIG. 2). In addition, the control input interface 120 can include an analog to digital converter 212 that samples an analog input signal at a configurable rate. Accordingly, the control input interface 120 can provide a digitized control signal or signals to the memory 122. Moreover, in at least some embodiments, the control input interface 120 can transform inputs into floating point values that can be used by or operated on by the FPGA 124. In accordance with at least some embodiments, the values can be floating point values connected into the IEEE 754 32-bit format prior to being stored in memory 122.

The memory 122 can include one or more memory arrays 122a-122n included as part of the FPGA, and/or as separate memory chips. In accordance with at least some embodiments, the memory 122 can include a dual port random access memory (RAM) that allows read and write operations to be performed at or about the same time. The memory or memories 122 can be connected internally to other components and structures of the FPGA by one or more signal lines 148 that provide a plurality of communication paths. In general, the memory 122 provides a plurality of addresses that can be used to store numeric or digital values representing control input signals, configuration parameters, control parameters, intermediate values returned from the FPGA 124, or the like. Accordingly, digitized control inputs provided by the control input interface 120 can be stored in particular addresses in memory 122. Furthermore, by using the memory 122 for storage of intermediate values, logic blocks 144 within the FPGA 124 can be reused, as discussed in greater detail elsewhere herein. Although not required, the memory 122 can be divided into memory arrays or segments devoted to control inputs, parameter inputs, or intermediate values respectively.

Figure 3:
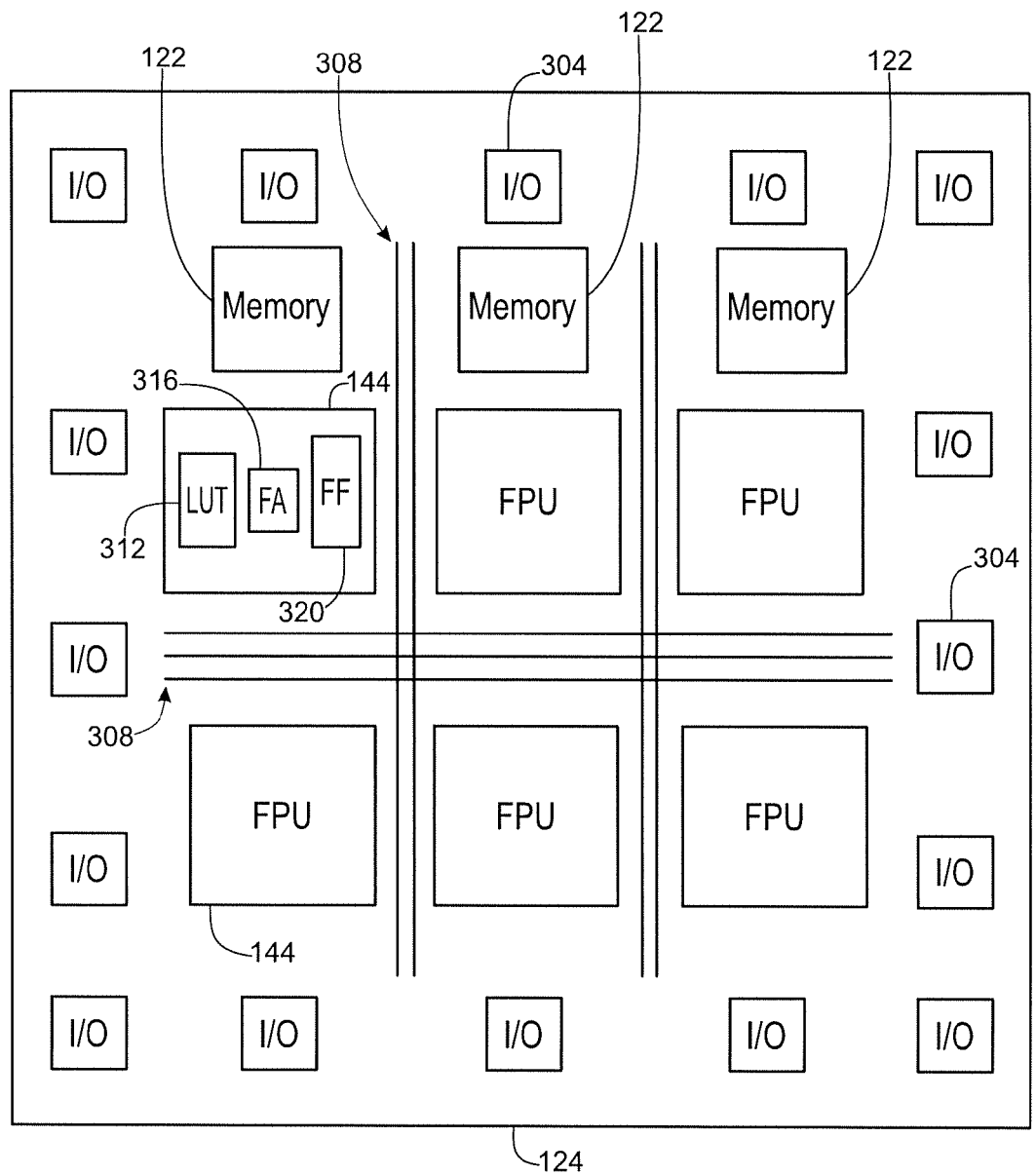
FIG. 3 depicts an example field programmable gate array in accordance with embodiments of the present disclosure.

As depicted in FIG. 3, the FPGA 124 may comprise an integrated circuit that includes the memory 122, and a plurality of programmable logic blocks or floating-point units (FPUs) 144 that can be configured to provide selected programming functions. Examples of operations that can be performed by FPUs 144 include, but are not limited to addition, subtraction, multiplication, division, combinational or other functions. Moreover, certain operations can require that multiple FPUs 144 be used in combination. Each of the logic blocks 144 can receive one or more inputs, and can generate one or more output values by performing a mathematical operation that applies the one or more inputs as an operand. The memory 122 and the logic blocks 144 can be selectively interconnected to one another or to input/output (I/O) blocks 304 using programmable interconnects 308. Values can be passed between locations in memory 122 and logic blocks or FPUs 144 by signal lines 148 established by one or more of the programmable interconnects 308. Accordingly, a value calculated by a logical block can be an intermediate output value that is applied as an operand by another logical block 144 to calculate a further intermediate output or a final output. Alternatively or in addition, a value calculated by a logical block 144 can be provided to an I/O block 304 that is in turn connected to a signal line 148 for delivery to a memory 122 that is provided separately from the FPGA.

Each of the logic blocks 144 within the FPGA 124 can include logic gates, which are formed from transistors and other electronic components that serve as the building blocks for components such as look-up tables 312, full adders 316, and D-type flip flops 320 that can be selectively interconnected to one another to provide desired logic functions. The interconnections between transistors and other components within logic blocks 144 can be preconfigured, or can be configured by the end user, to create logic blocks 144 having the desired functions. However, as can also be appreciated by one of skill in the art, the number of logical units or blocks 144 and the number of signal patterns or interconnects 308 available as part of an FPGA 124 are limited. According to embodiments of the present disclosure, such limitations can be at least partially addressed through an architecture for a controller 104 that allows reuse of the logic blocks 144 that have been configured on the FPGA 124. Moreover, embodiments of the present disclosure allow parameters associated with reused logic blocks 144 to be varied, depending on the position of an operation being performed by a particular logic block 144.

The controller 104 architecture provided by embodiments of the present disclosure utilizes memory 122, and in particular different addresses in memory 122, to store intermediate values obtained from programmable logic blocks or floating point units 144, at least temporarily. The intermediate values can then be routed to additional floating point units 144. The routing of values to locations in memory 122 as part of write operations performed at different clock cycles, and of values from memory 122 to a selected logic block 144 or to an output as part of read operations performed at different clock cycles, can be controlled by a state machine 152 running on the FPGA 124 or in an associated processor 156 (see FIG. 1). This architecture is flexible, and also allows floating point units 144 to be reused in a time multiplexed manner. For example, a particular floating point unit 144, such as floating point unit 144b in FIG. 2, can be provided with an intermediate value stored in a first address associated with a first memory 122a during a first clock cycle, to perform a first gain operation. At a later clock cycle, that floating point unit 144b can be provided with a different, second intermediate value stored in an address associated with the second memory 122b, to perform a multiplication or gain operation with respect to the second intermediate value. The amount of gain applied to the first and second values can be different. For example, by providing a parameter 134 in the form of a first gain value from memory 122 during the first clock cycle, by reading from a location in memory 122 in which a first parameter is stored, and by providing a parameter 134 in the form of a different gain value stored in a different location in memory 122 during a later clock cycle, the FPU 144b can be controlled to multiply provided values by different amounts. As can be appreciated by one of skill in the art after consideration of the present disclosure, the ability to reuse floating point units 144 provided by embodiments of the present disclosure can enable a particular FPGA 124 selected for use in a control system 104 to be smaller and less complex than would otherwise be the case, and/or to perform additional operations than would otherwise be possible.

Figure 4:
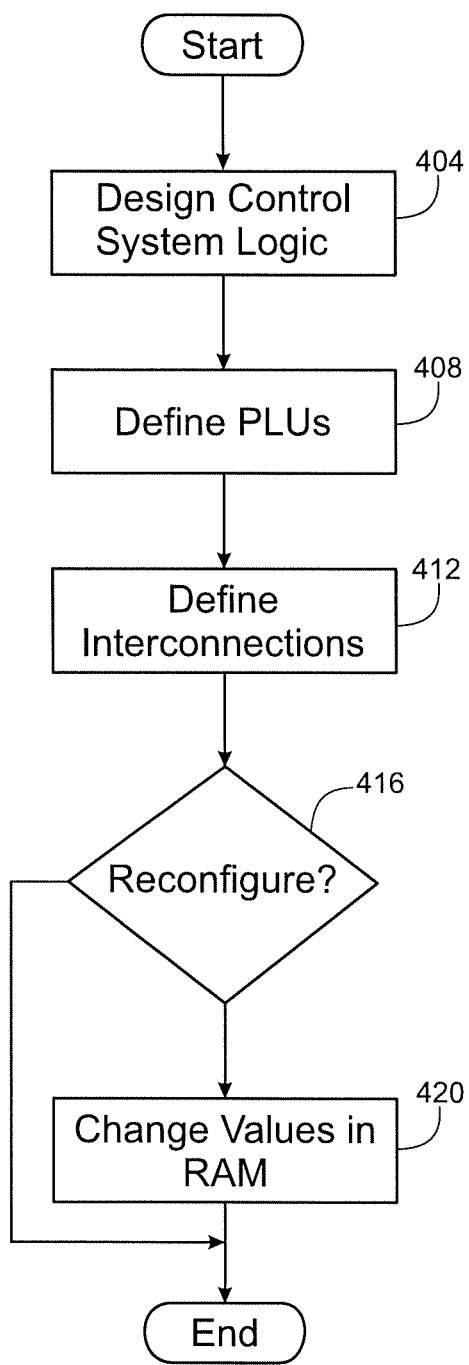
FIG. 4 is a flowchart depicting methods for providing a control system in accordance with embodiments of the present disclosure.

With reference now to FIG. 4, a method for providing a controller 104 in accordance with embodiments of the present disclosure is depicted. Initially, at step 404, the control system logic is designed. This can include determining the inputs that are available or are required, the different processing steps to be performed, and the order of those steps, and the output to be provided. In designing the control system logic, embodiments of the present disclosure allow functional blocks of the control system to be reused. For example, complex functions that are relatively resource intensive, such as floating point adders and multipliers, can be reused. Moreover, control systems in accordance with embodiments of the present disclosure can apply different parameters during different applications of a reused function block. The design of the control system logic can be performed using commercially available simulation software.

At step 408, the programmable logic blocks or floating point units 144 required to implement the control system design are defined. For example, the control system model generated in connection with designing the control system logic can be referenced to determine the configuration of the FPGA 124 needed to implement the control system logic in the FPGA 124. As part of defining the configuration of the FPGA 124, interconnections between the FPUs 144 and the input/output blocks 304 can be defined (step 412).

At step 416, a determination can be made as to whether parameters of the control system logic need to be reconfigured. In particular, because embodiments of the present disclosure allow various parameters of the control system 104 to be stored in memory 122, parameters can be adjusted in response to changed conditions, such as changes to operating environments, the control device 108, performance requirements, or any other reason. If it is determined that reconfiguration of parameters is desired, the values of the affected parameters can be changed in memory 122 (step 420). If it is determined that changes to parameter values are not necessary, the process of configuring the control system 104 can end.

Figure 5:
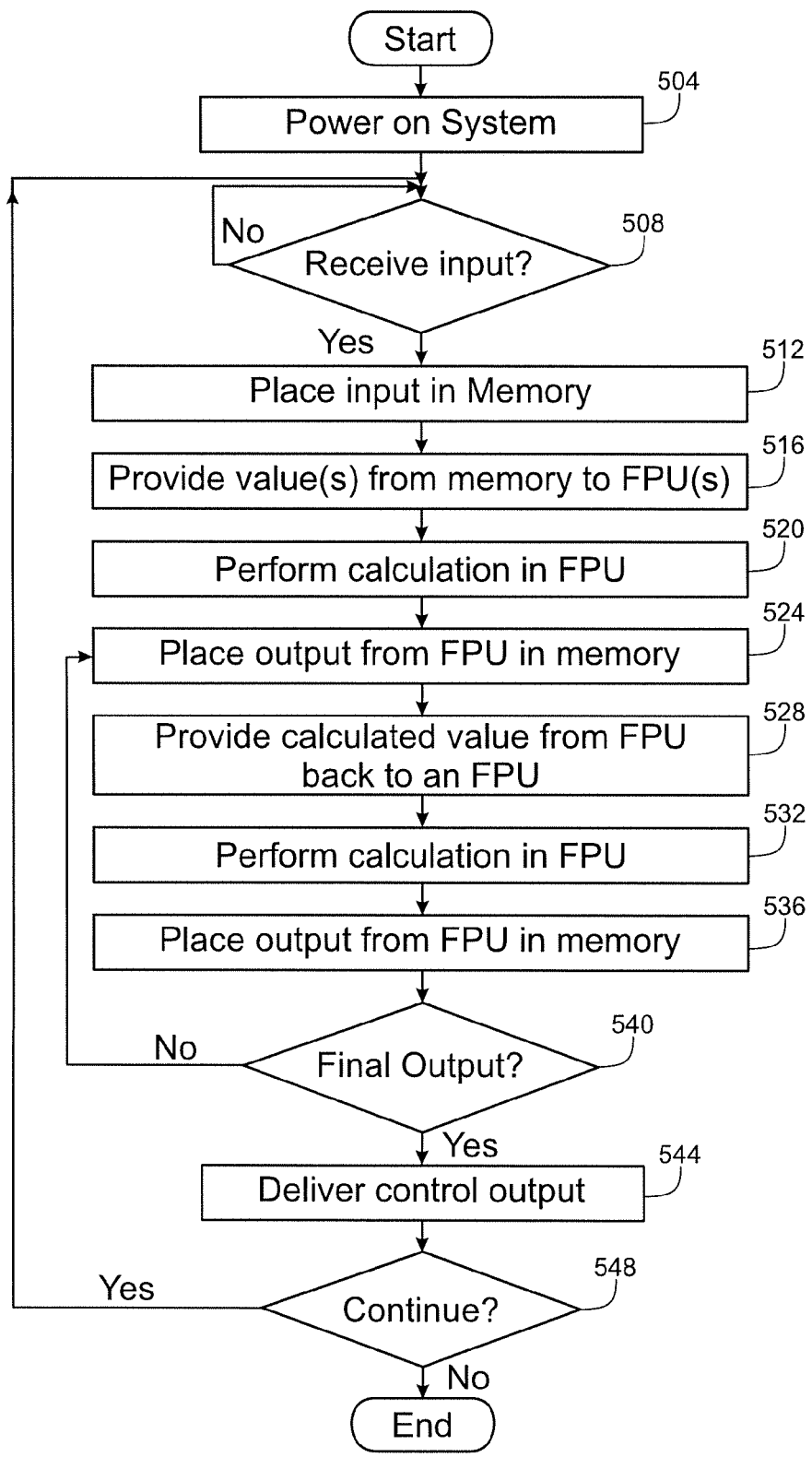
FIG. 5 is a flowchart depicting operation of a control system in accordance with embodiments of the present disclosure.

FIG. 5 is a flowchart depicting aspects of the operation of a control system 104 in accordance with embodiments of the present disclosure. At step 504, the control system 104 is powered on. Next, a determination is made as to whether an input, such as a control signal 132, 134 or 136, has been received (step 508).

If an input is received, the input can be placed in memory 122 (step 512). As can be appreciated by one of skill in the art after consideration of the present disclosure, the input that is placed in memory is a digital value or set of values. Moreover, digitization of the input can be performed by the control system 104, for example where a position sensor 140 or other source of control signals provides an analog signal. Where an analog signal is provided, such as may be generated by a position sensor 140, the control input interface 120 can perform signal conditioning, such as filtering an amplification, and can perform analog to digital conversion. As another example, where a control signal, such as a control signal 132 in the form of a pointing command is received as a digital signal, the control input interface 120 can provide that signal directly to memory 122. Whether received as an analog signal or a digital signal, the control input interface 120 can further transform the input signal 132, 134 or 136 to a floating point value before storing that value in memory 122.

The location in memory 122 that a control signal 132, 134 or 136 is placed in can depend on the source or nature of the particular control signal 132 or 136. For example, a control signal 132 in the form of a pointing command can be placed in a first location or address in memory 122, a control signal 136 representing a position signal can be placed in a second location or address in memory 122, and a control signal 134 in the form of a control parameter or a parameter used for configuring FPU 144 can be placed in a third location or address in memory 122. Moreover, different areas or sections of memory 122, or separate memories 122, can be provided for different signals. For example, control signals 132 can be stored in a control section of memory or a control memory 122, processing parameters 134 can be stored in a parameter section of memory or a parameter memory 122, and position signals 136 can be stored in a position signal section of memory or a position signal memory 122. The routing of the input signals 132, 134, or 136 to particular locations can be determined by an input at which a signal is received, or by a control program or routine running on the FPGA 124, or on an associated processor that implements a state machine, or combinations thereof.

Next, stored values are provided from memory 122 to one or more FPUs 144 in the FPGA 124 (step 516). For example, a pointing control signal 132 from a first location in memory 122 and a position signal 136 can be provided from a second location in memory 122 to a first FPU 144 to calculate a difference signal. As yet another example, a control signal 132 in the form of a parameter value stored in a third location in memory 122 can be provided to another FPU 144 to, for example, determine an amount of gain to be applied to the difference signal calculated by the first FPU 144. The routing of the values from a particular location or locations in memory 122 to a selected FPU 144 can be controlled by the state machine with reference to a clock cycle or heartbeat. Next, the FPU 144 processes the provided signal or signals (step 520). The output provided by the FPU 144 as a result of the operation it performs is placed in memory 122 (step 524). The particular location in memory 122 to which the output of the FPU 144 is directed can be configured based on operation of the state machine. At step 528, the output calculated by the FPU 144 in the previous operation, and stored in memory 122, is provided from that location in memory 122 to another FPU 144, identified by the state machine. The other FPU 144 then performs a calculation or operation, using the intermediate output value calculated (step 532). In accordance with embodiments of the present disclosure, the other FPU 144 can be an FPU 144 that was used in a previous operation in connection with another operand. Moreover, the operation can be modified, for example by providing different parameters values 134, for the different operations. The output from the other FPU 144 is then provided to a location in memory 122 determined by the state machine (step 536). Accordingly, embodiments of the present disclosure provide for passing values between memory 122 and FPUs 144 included in the FPGA 124.

At step 540, a determination is made as to whether a final output value has been calculated by the control system 104.

This determination can be made by the state machine, for example with reference to a current clock cycle. If the final output value has not been calculated, the process can return to step 524, where the value calculated by the FPU in the previous step is placed in memory. In accordance with embodiments of the present disclosure, by providing outputs from one or more FPUs 144 to memory 122, those outputs can be provided to FPUs 144 that have been used in prior calculation steps. Accordingly, functions provided by FPUs 144 can be reused. Moreover, control parameters associated with a reused FPU 144 can be varied, for example depending on the position of a particular calculation step within the overall operation of the control system 104. For example, in a first use of a particular FPU 144, a gain applied by that FPU 144 can be a first value, while the gain applied by that FPU can be a second value during a second use of that FPU in connection with calculating a particular output.

If a final output has been calculated, it is delivered as a control output to the control output interface 128 (step 544). The control output interface 128 can then deliver the calculated control output to the actuator or other device. Moreover, the control output can provide the final output signal in a format convenient or necessary for transmission or use by the controlled device 108. For example, the first output signal can be converted from a digital signal to an analog signal by the control output interface 128, prior to delivery to an actuator 114 or other component of the controlled device 108. Alternatively, digital to analog conversion can be performed at the controlled device 108, or in an intermediate component. If operation of the control system 104 is to continue, the process can return to step 508, where an additional input or inputs are received and used to calculate a new output signal (step 548). Alternatively, the process can end.

Figure 6:
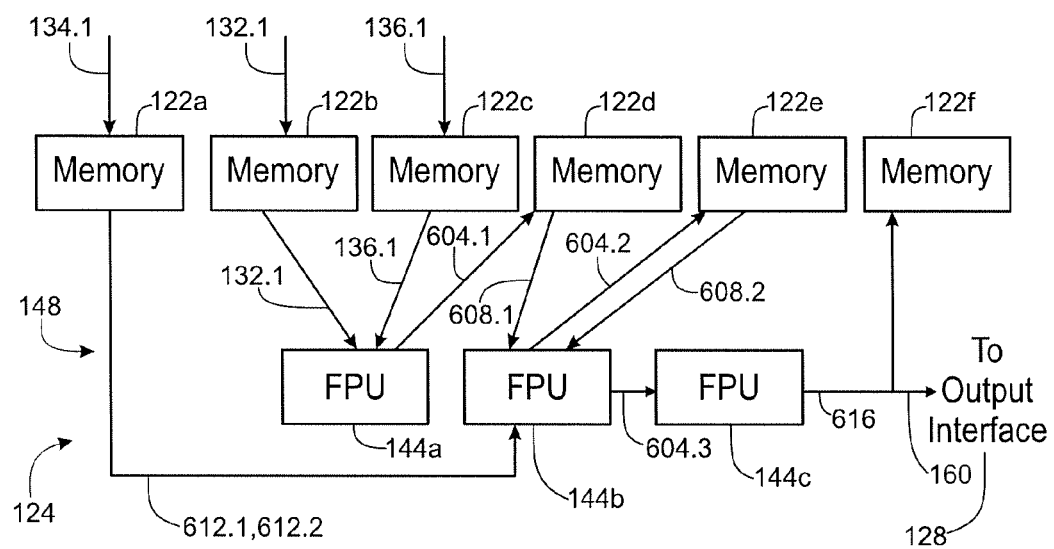
FIG. 6 depicts data flows between components of a controller in accordance with embodiments of the present disclosure.

FIG. 6 depicts data flows between components of a controller volume 104 in accordance with embodiments of the present disclosure. In particular, the flow of data is in the form of input values and output values, including intermediate output values, over communication paths provided by signal lines between one or more memories 122 and other components of the controller 104. In this example, provided to illustrate aspects of the operation of exemplary embodiments of the present disclosure, an input signal in the form of a parameter value 134.1 is provided to a first memory 122*a*. As can be appreciated by one of skill in the art after consideration of the present disclosure, a parameter control signal 134 can adjust aspects of the operation of a control system 104 in order to accommodate different controlled system 114 or environmental conditions. For example, by providing different parameter control values 134, a control system 104 can be reconfigured from an initial configuration to adapt to a scanner tracker 112 using a different size mirror, different actuator configuration, or the like. In addition, an actuation control signal provided in the form of an actuation control signal 132 is provided to a second memory 122*b*. As can be appreciated by one of skill in the art after consideration of the present disclosure, where the control system 104 is operated in connection with a scanner tracker 112, the actuation control signal 132 can be in the form of a pointing or error signal. Another input is a position or other signal 136 that can be provided to a third memory or location in memory 122*c*. The position signal 136 can, for example, be provided by a position sensor 140 and can indicate the current position of a mirror 112 or other component of a controlled device 108.

The values representing the input signals 132, 134 and 136 can be provided from memory to one or more FPUs 144 at a clock cycle following the clock cycle at which these values 132, 134 and 136 were written to memory. For example, the control signal input 132 comprising a pointing signal 132.1, and the control signal 136 comprising a position signal 136.1 can be provided from the second 122*b* and third 122*c* memories to a first FPU 144*a*. The memory 122 locations from which a value is read and the FPU 144 to which the value is delivered can be determined by a state machine running on the FPGA 124, and on the current clock cycle.

The first FPU 144*a* can then (e.g., over a next series of clock cycles) perform a predefined calculation or function with respect to the control signals 132 and 136, and can produce an output that is written to a fourth memory 122*d* on a clock cycle following completion of the calculation by the FPU 144*a* as a first intermediate output 604.1. As an example, but without limitation, the first FPU 144*a* can perform a difference calculation to determine the amount by which a commanded pointing angle of a mirror 112 differs from the actual angle of the mirror 112.

At a next clock cycle, the state machine can direct that the output of the first FPU 144*a* stored in memory 122*d* be delivered as an input 608.1 to a second FPU 144*b*. As an example, but without limitation, the second FPU 144*b* may be configured to perform a gain or multiplication operation. Moreover, the amount of gain applied by the FPU 144*b* can be determined by the control signal comprising the parameter 134.1 stored in the first memory 122*a* that is provided to the second FPU 144*b* as an input signal 612.1. The value calculated by the second FPU 144*b* can be written to another location in memory 122*e*, according to the programming of the FPGA 124 by the state machine, as a second intermediate output value 604.2.

In accordance with embodiments of the present disclosure, FPU, or logic blocks 144 can be reused. For example, the second intermediate output value 604.2 stored in memory 122*e* can be delivered to the second FPU 144*b* as an input 608.2 for another gain calculation performed at a later clock cycle. During this second operation, the second FPU 144*b* can apply the same or a different gain value, as determined by a control parameter 134 provided to the second FPU 144*b*. For example, a second parameter 134.2 stored in the memory 122*b* can be provided as a second parameter control signal 612.2 to the second FPU 144*b* for application during the second operation. For instance, where a first control parameter 612.1 was also stored in first memory 122*a*, the second control parameter 612.2 can be stored in a different location or address within the first memory 122*a*, or the first control parameter 612.1 may have been replaced by the second control parameter 612.2. As yet another example, the second control parameter 612.2 could be obtained from a different memory 122 or memory location. The second operation of the second FPU 144*b* can result in the calculation of a third intermediate output value 604.3.

In accordance with embodiments of the present disclosure, an output from a logical block or FPU 144 need not be delivered back to a location in memory 122 in every instance. Instead, the output can be delivered to another logical block or FPU 144. That is, the provision of the output of the second FPU 144*b* to the third FPU 144*c* can be a conventional routing step directly between logical blocks 144 of the FPGA 124, rather than a step of providing the output from the second 144*b* to a memory 122 that is separate from the FPGA 124. The processing performed by the third FPU 144*c* can be a different operation than the processing performed by the second FPU 144*b*. Alternatively or in addition, the second 144b and third 144c FPUs can together perform an operation that is more complex than a single FPU 144 can perform. In the example of FIG. 6, the second operation of the FPU 144b results in an intermediate output value 604.3 that is delivered to a third FPU 144c. The third FPU 144c can then perform an operation, resulting in the calculation of another output value, which can be delivered to a location in memory 122 or to another logical block or FPU 144. Alternatively, as depicted in FIG. 6, the output from the third FPU 144c can be determined, for example by the state machine and the current clock cycle, to be a final output value 616. The final output 616 can then be delivered via an I/O block 304 to a control output interface 128 over an output signal line 160 (see FIG. 1) for conversion to an analog signal and delivery to an actuator 114 or other control device 108 component. The output from the third FPU 144c can also be delivered to a fifth memory 122e.

In addition to reusing FPUs 144, a control system 104 in accordance with embodiments of the present disclosure can utilize FPUs 144 in parallel (i.e., at the same time). For example, the same value can be delivered from an address in memory 122 to two or more different FPUs 144 for processing during the same or an overlapping set of clock cycles. As another example, different values from different addresses in memory 122 can be delivered to different FPUs 144 for processing during the same or an overlapping set of clock cycles.

Embodiments of the present disclosure address limitations of conventional control systems utilizing FPGAs by using memory as a repository for intermediate values calculated by the FPU, and for control signals. In particular, this allows the control system to be adapted to different conditions, to reuse logical blocks of the FPGA, or both. Although embodiments of the present disclosure have discussed use of a controller 104 as disclosed herein in connection with controlling the operation of a scanner tracker or fast steering mirror, it should be appreciated that a controller as disclosed herein is not limited to such applications. In particular, embodiments of the present disclosure can be used in connection with any type of system, the operation of which can be controlled by a controller. Embodiments of the present disclosure can utilize a space qualified FPGA 124 and other system 100 components, for use in extraterrestrial application. In the foregoing description, different memories 122 and FPUs 144 have been described as a "first", "second" or "third" FPU or memory 122. However, it should be appreciated that such nomenclature is not intended to imply a fixed ordering of components. Moreover, any number of FPGAs 124, memories 122, or other components can be included in a controller 104 in accordance with embodiments of the present disclosure.

The foregoing discussion of the invention has been presented for purposes of illustration and description. Further, the description is not intended to limit the invention to the form disclosed herein. Consequently, variations and modifications commensurate with the above teachings, within the skill or knowledge of the relevant art, are within the scope of the present invention. The embodiments described hereinabove are further intended to explain the best mode presently known of practicing the invention and to enable others skilled in the art to utilize the invention in such or in other embodiments and with various modifications required by the particular application or use of the invention. It is intended that the appended claims be construed to include alternative embodiments to the extent permitted by the prior art.

What is claimed is:

1. A method for controlling a physical system, comprising:
   receiving an input signal at an input port, wherein the input signal represents a first system parameter;
   storing the input signal at a first address in a memory;
   providing the input signal from the first address in the memory as an operand to a first functional block of a field programmable gate array (FPGA), wherein the first functional block generates at least a first intermediate output value, wherein the first functional block is determined by a state machine, and wherein the input signal is provided from the first address in the memory to the first functional block over a first programmable interconnect;
   storing the first intermediate output value in a second address in the memory, wherein the second address in the memory is determined by the state machine, and wherein the first intermediate output value is provided from the first functional block to the second address in the memory over a second programmable interconnect;
   providing the first intermediate output value from the second address in the memory as an operand to a second functional block of the FPGA, wherein the second functional block generates at least a second intermediate output value, wherein the second functional block is determined by the state machine, and wherein the first intermediate output is provided from the second address in the memory to the second functional block over a third programmable interconnect;
   storing the second intermediate output value in a third address in the memory, wherein the third address in the memory is determined by the state machine, and wherein the second intermediate output value is provided from the second functional block to the third address in the memory over a fourth programmable interconnect; and
   providing a final output value from the memory to an output port.

2. The method of claim 1, further comprising:
   providing the second intermediate output value from the third address in the memory as an operand to the first functional block of the FPGA, wherein the first functional block generates a third intermediate output value, and wherein operations of the functional blocks are performed in a timed sequence.

3. The method of claim 2, wherein the generation of the first intermediate output value by the first functional block of the FPGA and the generation of the third intermediate output value are performed at different times.

4. The method of claim 3, further comprising:
   providing a first parameter value from the memory to the first functional block of the FPGA;
   providing a second parameter value from the memory to the first functional block of the FPGA, wherein at least the first parameter value is applied by the first functional block of the FPGA in generating the first intermediate output value.

5. The method of claim 4, wherein the second parameter value is applied by the first functional block of the FPGA in generating the third intermediate value.

6. The method of claim 1, wherein at least the first functional block uses a math processing parameter to perform an operation on an operand, and wherein the math processing parameter is stored in the memory, the method further comprising:

providing a first parameter value from the memory to the first functional block of the FPGA, wherein the first parameter value is the math processing parameter.

7. The method of claim 6, wherein the first parameter value is applied by the first functional block of the FPGA in generating the first intermediate output value.

8. The method of claim 1, wherein the first functional block of the FPGA is a floating point math processing unit.

9. The method of claim 8, wherein the floating point math processing unit performs at least one of the following operations: addition, subtraction, multiplication, division, and absolute value generation.

10. The method of claim 1, further comprising:
receiving an analog input signal at an input interface;
filtering the analog input signal to obtain a filtered input signal;
digitizing the filtered input signal to obtain a digital input signal;
converting the digital input signal to a floating point formatted value, wherein the floating point formatted value is the input signal stored in the first address in the memory.

11. The method of claim 10, wherein the analog input signal is received from a sensor, and wherein the output signal is provided from the output port to an actuator.

12. A system, comprising:
a sensor, wherein the sensor is operable to provide an analog output signal;
an input interface, wherein the input interface is operable to receive the analog output signal from the sensor as an input signal and to convert the analog output signal to a digital input signal;
a field programmable gate array (FPGA), wherein a plurality of functional processing units (FPUs) are defined in the FPGA;
memory, wherein the memory includes a plurality of memory locations, and wherein each of the plurality of memory locations is associated with an address;
a state machine;
a plurality of programmable interconnects, wherein a plurality of communication paths are formed using the programmable interconnects, based on operation of the state machine;
and
an actuator, wherein the actuator is connected to an output of the FPGA by an output signal line,
wherein a first memory location having a first memory address receives the digital input signal from the input interface during a first clock cycle,
wherein the first memory location is operable to store the digital input signal received from the input interface,
wherein the first memory location is connected to a first FPU by a first communication path during at least a second clock cycle,
wherein the first communication path is operable to provide the digital input signal to the first FPU during the second clock cycle,
wherein the first FPU is operable to generate a first intermediate value using the digital input signal,
wherein a second memory location having a second memory address is connected to the first FPU by a second communication path during at least a third clock cycle,
wherein the second communication path is operable to provide the first intermediate value to the second memory location during the third clock cycle,
wherein the second memory location is operable to store the first intermediate value,
wherein a second FPU is connected to the second memory location by a third communication path during at least a fourth clock cycle,
wherein the third communication path is operable to provide the first intermediate value to the second FPU during the fourth clock cycle,
wherein the second FPU is operable to generate one of a second intermediate value and a final output value,
wherein a third memory location having a third memory address is connected to the second FPU by a fourth communication path during at least a fifth clock cycle, and
wherein the fourth communication path is operable to provide the one of the second intermediate value and the final output value to the third memory location during the fifth clock cycle.

13. The system of claim 12, wherein the memory is a dual-port memory included as part of the FPGA.

14. The system of claim 13, wherein the sensor is a position sensor, and wherein the actuator is a motor.

15. The system of claim 12, wherein a fourth memory location is connected to a parameter input of the first FPU during the second clock cycle.

16. The system of claim 12, wherein the second FPU is operable to generate a second intermediate value, wherein the third memory location is operable to store the second intermediate value, wherein a fifth communication path is operable to provide an operand to the second FPU during a sixth cycle, wherein the second FPU is operable to generate one of a third intermediate value and a final output value using the operand.

17. The system of claim 12, wherein the second FPU is operable to generate a second intermediate value,
wherein the third memory location is operable to store the second intermediate value,
wherein a third FPU is operable to generate a third intermediate value,
wherein a fourth memory location having a fourth memory address is connected to the third FPU by a fifth communication path during at least a sixth clock cycle,
wherein the fourth memory location is operable to store the third intermediate value,
wherein the third FPU is further operable to generate a fourth intermediate value,
wherein a fifth memory location having a fifth memory address is connected to the third FPU by a sixth communication path during at least a sixth clock cycle, and
wherein the fifth memory location is operable to store the fourth intermediate value.

* * * * *